United States Patent [19]
Rees

[11] Patent Number: 5,894,241
[45] Date of Patent: Apr. 13, 1999

[54] BOOTSTRAP AUGMENTATION CIRCUIT AND METHOD

[75] Inventor: David B. Rees, Overton, United Kingdom

[73] Assignee: Cypress Semiconductor Corp., San Jose, Calif.

[21] Appl. No.: 08/723,076

[22] Filed: Sep. 30, 1996

[51] Int. Cl.$^6$ .................................................. H03K 17/16
[52] U.S. Cl. .................... 327/390; 327/109; 327/589; 326/27; 326/88
[58] Field of Search .................... 327/108–112, 374–377, 327/390, 589; 326/88, 27

[56] References Cited

U.S. PATENT DOCUMENTS

| | | | |
|---|---|---|---|
| 4,042,838 | 8/1977 | Street et al. | 326/88 |
| 4,219,743 | 8/1980 | Millns et al. | 326/87 |
| 4,484,092 | 11/1984 | Campbell, Jr. | 326/87 |
| 4,503,343 | 3/1985 | Ohuchi | 326/88 |
| 4,540,898 | 9/1985 | Pumo et al. | 327/291 |
| 4,612,462 | 9/1986 | Asano et al. | 326/107 |
| 4,725,746 | 2/1988 | Segawa et al. | 326/88 |
| 5,216,290 | 6/1993 | Childers | 327/530 |
| 5,241,502 | 8/1993 | Lee et al. | 365/203 |
| 5,270,588 | 12/1993 | Choi | 326/88 |

(List continued on next page.)

FOREIGN PATENT DOCUMENTS

| | | |
|---|---|---|
| 0045133 | 2/1982 | European Pat. Off. . |
| 0046498 | 3/1982 | European Pat. Off. . |
| 00129661 | 1/1985 | European Pat. Off. . |
| 52-35570 | 3/1977 | Japan . |
| 53-125753 | 2/1978 | Japan . |
| 59-16424 | 1/1984 | Japan . |

OTHER PUBLICATIONS

Lewis et al, "Bootstrapped FET Driver", IBM Technical Disclosure Bulletin, vol. 18, No. 11, Apr. 1976.
Kalter et al, "Field Effect Transistor Driver Circuit", IBM Technical Disclosure Bulletin, vol. 18, No. 4, Sep. 1975.
"MOSFET Powering Circuit", Sonoda, G., IBM Technical Disclosure Bulletin, vol. 13, No. 9, p. 2658, Feb. 1971.

(List continued on next page.)

*Primary Examiner*—Kenneth B. Wells
*Attorney, Agent, or Firm*—Maiorana & Acosta, P.C.

[57] ABSTRACT

An augmentation circuit for use in connection with a self-bootstrap type output buffer having an n-channel pullup transistor is disclosed. The augmentation circuit includes a capacitor formed by a second n-channel transistor, connected as a capacitor, and disposed between first and second capacitor terminals. A non-overlapping signal generator is formed from a pair of NOR gates, and an inverter, to generate a pair of control signals CS1, and CS2 wherein when one of the control signals is active, the other control signal is inactive. Four n-channel transistors are provided in a switching matrix. One pair of the four n-channel transistors responds to control signal CS2 to connect the capacitor formed by the n-channel transistor across and between ground, and the output pad. In this switched configuration, a voltage level on the output pad is effectively impressed upon the capacitor, and is stored thereon. When an input signal to the buffer changes state to a logic high signal, the output of the control signals also change state, wherein the two n-channel transistors previously conducting, are now turned OFF, and the other two of the four n-channel transistors, which are controlled by CS1, are made to conduct. In this second switched configuration, the capacitor is connected across and between the positive power supply $V_{cc}$, and a gate terminal of the pullup n-channel power supply. Accordingly, a voltage magnitude equal to $V_{cc}$ plus the pad voltage level stored on the capacitor is developed by the augmentation circuit and transferred to the gate of the pullup transistor. In another embodiment, a pair of transfer gates are used, which are controlled by a voltage level on the output node, to augment the input signal voltage level (using a stored level of approximately $V_{cc}$). In a third low power embodiment, a capacitor (e.g. a p-channel device) is charged to $V_{cc}$ and is used to provide the required augmentation, as a function of the output node voltage.

26 Claims, 4 Drawing Sheets

U.S. PATENT DOCUMENTS

| | | | |
|---|---|---|---|
| 5,281,869 | 1/1994 | Lundberg | 326/21 |
| 5,365,118 | 11/1994 | Wilcox | 327/390 |
| 5,381,061 | 1/1995 | Davis | 326/57 |
| 5,399,920 | 3/1995 | Van Tran | 326/83 |
| 5,514,994 | 5/1996 | Sawada | 327/390 |
| 5,587,678 | 12/1996 | Dijkmans | 327/377 |

OTHER PUBLICATIONS

"Bootstrap Inverter Driver," Harroun, V.T., IBM Technical Disclosure Bulletin, vol. 19, No. 3, pp. 827–828, Aug. 1976.

"Bufferized ECL–Type Logic Circuit," IBM Technical Disclosure Bulletin, vol. 33, No. 4, pp.343–344, Sep. 1990.

BOOTSTRAP AUGMENTATION CIRCUIT AND METHOD

INCORPORATION BY REFERENCE

This application is related to copending application entitled "Ultra Low Power Pumped N-Channel Output Buffer With Self-Bootstrap", Ser. No. 08/723,077, filed Sep. 30, 1996, which is commonly owned, filed simultaneously herewith and hereby incorporated by reference.

BACKGROUND OF THE INVENTION

1. Field of the Invention

The present invention relates generally to output buffers of the type employed to control the voltage on an output pad of a semiconductor device, and, more particularly, to a circuit for use with a self-bootstrap type n-channel output buffer that augments the self-bootstrapping capability of such buffer when the output pad transitions to a logic one state from an initial state with a non-zero voltage magnitude.

2. Description of the Related Art

A self-bootstrapping buffer, for example, of the type using a pullup n-channel field effect transistor, such as disclosed in my copending application entitled "Ultra Low Power Pumped N-Channel Output Buffer With Self-Bootstrap", employs a gate-to-source capacitance $C_{gs}$ of the pullup transistor to bootstrap an input data signal in order to provide the needed pumped gate drive signal. In this configuration, a drain terminal of the pullup transistor is tied to $V_{cc}$, a source terminal is tied to the pad, and the gate terminal receives the input drive signal. In particular, a potential problem arises when the input data signal is driven high to turn-on the pullup transistor but the output node voltage is not at a logic zero. This situation may occur, for example, when the output of the buffer is tri-stated, and, the output node has been pulled to a logic one by some other device, or, perhaps, when the input data is changing very fast so that the output node does no more than "glitch" towards a logic zero state before being driven back to a logic one state.

When the output node is not near ground potential (i.e., zero volts), then the self-bootstrapping will either not occur, or, alternatively, will not happen to a sufficient degree. For example, if the output node (i.e., a first capacitor terminal of $C_{gs}$) is at a logic one, then, when the input data signal transitions from a low to a high state, thus placing a logic high on a second capacitor terminal of $C_{gs}$, there is no final voltage developed across $C_{gs}$. Accordingly, once the pullup transistor conducts, the boost amount developed on the gate terminal of the pullup transistor, does not rise appreciably above the device operating voltage level $V_{cc}$. Under these circumstances, the pullup transistor having no "pumped" gate drive signal on the gate terminal, would be incapable of generating the desired output voltage ($V_{OH}$) (for example, $V_{cc}$ when $V_{cc}$=3.3 volts), and current ($I_{OH}$) levels for the logic high state.

Accordingly, there is a need to provide a circuit and method for use with a self-bootstrapping output buffer of the type suitable for driving an output pad of the semiconductor device, that reduces or eliminates one or more of the problems as described above, and, in particular, addresses the problem related to the impairment or failure of the self-bootstrapping mechanism which may occur when the output node is not at zero volts when the input data signal begins to change from a logic zero to a logic one.

SUMMARY OF THE INVENTION

It is an object of the present invention to provide a circuit and method for use with a self-bootstrapping output buffer which solves the self-bootstrapping problem that arises when the output node is not at zero volts when the input data signal begins to change from a logic zero to a logic one. The inventive circuit and method achieves this and other objects by augmenting the self-bootstrapping mechanism when the circuit senses that the output pad has a non-zero voltage magnitude impressed thereon.

A self-bootstrapping output buffer in accordance with this invention is responsive to an input signal for generating an output signal on a pad connected thereto. The output buffer includes pullup means, such as an n-channel field effect transistor in a preferred embodiment, for pulling the output signal to a logic one state. The pullup means itself includes a self-bootstrap capacitance associated therewith. The buffer further includes a circuit or means for augmenting a boost amount contributed by the self-bootstrap capacitance when the pad voltage level has a non-zero voltage magnitude thereon when the input data signal begins to change from a logic zero to a logic one. The pullup transistor provides the means for generating the logic high state at a voltage magnitude substantially equal to a device operating voltage level (e.g., $V_{cc}$). The self-bootstrap capacitance, in a preferred embodiment, is defined by a gate-to-source overlap capacitance $C_{gs}$, and is used to bootstrap the input data signal to develop a boosted gate drive signal (which is limited as a function of the pad voltage). The augmenting means provides an additional boost amount when the pad has a non-zero voltage magnitude thereon when the input data signal begins to change from a logic zero to a logic one to ensure that the voltage developed at the gate terminal is greater than, in a preferred embodiment, the device operating voltage $V_{cc}$. This "pumped" gate drive enables the n-channel pullup transistor to generate the output signal, when in the logic high state, at a level substantially equal to $V_{cc}$.

In a preferred embodiment, the augmenting means comprises sensing means for sensing and storing the pad voltage level, and, switching means for selectively connecting the sensing means to the gate terminal of the n-channel transistor, according to the input signal. The sensing means may take the form of a capacitor, and, in this preferred embodiment, takes the form of a second n-channel transistor connected as a capacitor. The switching means, during a pre-boost time period, connects a first capacitor terminal (i.e., preferably, the source and drain terminals of the second n-channel transistor) to ground, while connecting the second capacitor terminal (i.e., preferably, the gate terminal of the second n-channel transistor) to the output pad. The pad voltage level is thus captured by the capacitor formed by the n-channel transistor. During a boost time interval, the switching means switches the capacitor terminal previously connected to ground, to $V_{cc}$, while switching the other capacitor terminal, previously connected to the output pad, to the gate terminal of the pullup n-channel transistor. Thus, to the extent that the output pad was above zero volts during the pre-boost time interval (and thus diminished the effect of the self-bootstrapping), such overvoltage is captured by the capacitor and applied to the gate terminal of the pullup transistor, to supplement or augment the self-bootstrapping which occurs by way of the gate-to-source capacitance $C_{gs}$.

In a second, preferred embodiment, in addition to the pullup n-channel transistor mentioned above, the augmentation means of the buffer includes capacitance means, such as another n-channel transistor connected as a capacitor (connected in the same manner as described above), and switching means. In this alternate embodiment, one terminal of the "capacitor" so formed is connected to the gate of the n-channel pullup transistor, while the other terminal is connected to a reference node. The switching means in this alternate embodiment selectively connects the reference node to the gate terminal of the pullup transistor when the pad voltage level defines a logic low state. Thus, when there is substantially no voltage on the output pad, both terminals of the capacitor are tied to the same node, and the capacitor does not store any charge. However, when the voltage level on the pad defines a logic one state, the reference node is connected to the output of a delay circuit for receiving a delayed version of the input data signal. For a period of time when the input signal propagates through this delay circuit, one terminal of the "capacitor" is connected to the gate terminal of the pullup transistor and is thus receiving a logic one (e.g., may be equal to $V_{cc}$) while the other end of the "capacitor" is tied, by way of the reference node, to the output of the delay circuit, which is, for this delay period, still at a logic zero (i.e., the now-logic-one input signal has not yet propagated to the output of the delay circuit). Thus, during this interval, the transistor connected as a capacitor is charged to a level substantially equal to the device operating voltage $V_{cc}$ (or whatever level the input signal is). When the output of the delay circuit transitions from low-to-high after the propagation delay interval, the second terminal of the capacitor is moved from a logic zero, to a logic one. This shift, in turn, boosts the level at the first end (gate of the pullup) of the capacitor well above $V_{cc}$. This "boosted" gate drive enables the n-channel pullup transistor to develop an output signal in the logic high state at a level substantially equal to $V_{cc}$, as desirable when $V_{cc}=3.3$ volts, for example.

In another aspect of this invention, a method of operating a self-bootstrapping output buffer is provided, and includes four basic steps. The first step involves sensing, before a time when the output signal is be in a logic state, a pad voltage level on the pad. The second step involves storing the pad voltage level sensed in the first step. Third, applying an input signal to a control terminal of the pullup transistor wherein the self-bootstrap capacitance, in response thereto, boosts the voltage magnitude appearing on the control terminal upwards, as a function of the then-existing pad voltage level. Finally, the fourth step involves augmenting a boost amount contributed by the self-bootstrap capacitance, using the stored pad voltage, to ensure that the voltage magnitude developed at the control terminal is greater than the device operating voltage level (i.e., preferably, $V_{cc}$). Under these circumstances, the pullup transistor is capable of generating a logic high state at a level substantially equal to $V_{cc}$.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENTS

Figure 1:
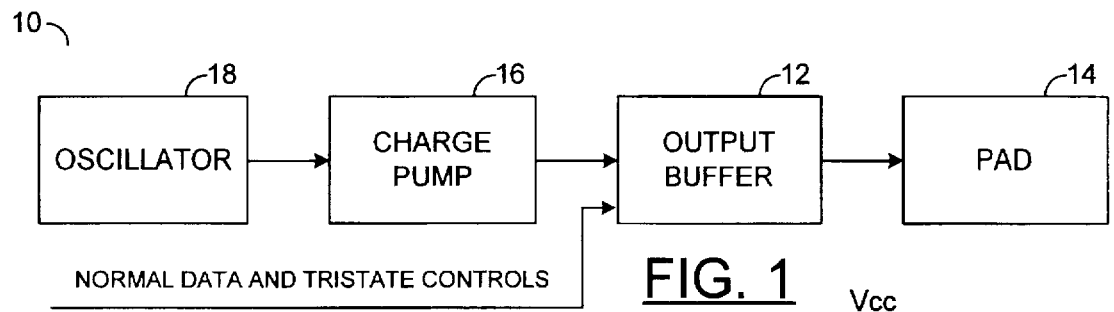
FIG. 1 is a simplified, block diagram view of a portion of a semiconductor device, particularly an output buffer, including a preferred embodiment of the present invention.

Referring now to the drawings wherein like reference numerals are used to identify identical components in the various views, FIG. 1 shows a portion of semiconductor device 10 fabricated in accordance with the present invention. Device 10 includes an output buffer 12, which is adapted to be connected to a corresponding pad 14. It should be appreciated that in a commercial device 10, it may be desirable to have a plurality of such output buffers, connected to a corresponding plurality of pads $14_i$.

The augmentation circuit and method of the present invention to be described hereinafter is preferably contemplated for use with an ultra low power pumped n-channel output buffer, as disclosed and claimed in the copending application entitled "Ultra Low Power Pumped N-Channel Output Buffer With Self-Bootstrap", referred to under Incorporation by Reference. However, the present invention is not so limited in its application or use, and the Incorporation by Reference and disclosure of a preferred use of the present invention with the particular output buffer in the related application should not be understood as limiting its general applicability, the scope of which is limited only by the appended claims. The description that follows regarding output buffers is provided to teach one of ordinary skill how to use the inventive augmentation circuit and method, and is purely exemplary in nature.

Output buffer 12, the details of which appear hereinafter, provides the general function of responding to an input data signal from a function block (not shown), and, responds accordingly to generate an output signal on pad 14 connected thereto. Output buffer 12, as is well-known, may drive the voltage level on pad 14 to a predetermined voltage level for a logic high state ($V_{OH}$), and, may source a predetermined current level in such a high logic state ($I_{OH}$). Alternatively, output buffer 12 may also perform the function of pulling the voltage level on the pad 14 to a logic low state, and sink a predetermined maximum current in such low state. Further, the output buffer may be controlled to a high impedance state (i.e., "tri-stated"). These basic functions of buffer 12 are well understood, and need no further elaboration.

Pad 14 is provided for connecting the output signal appearing thereon to a corresponding conductor (e.g., pin) disposed in a semiconductor package to interface with signals external to the semiconductor device (e.g., such as a bus, or a backplane).

As described in the copending application referred to above, such an output buffer, generally, may require a charge pump 16 that is provided for supplying, on one or more output lines thereof, a corresponding number of "pumped" voltages each of which is higher than the device operating voltage $V_{cc}$. Charge pump 16 may employ the use of an oscillator 18, as is conventional and well-known, in order to generate such voltage levels. Charge pump 16 may take any one of a number of known forms for purposes of the present invention. Accordingly, no specific structure for performing the function of charge pump 16 is described herein nor is such description believed necessary. It should be appreciated, however, that although the augmentation circuit according to the present invention is preferably contemplated as being used in connection with the pumped n-channel output buffer disclosed in my copending application referred to under Incorporation by Reference, such use is not exclusive, and other uses of the inventive augmentation circuit and method, particularly its use with other types of output buffers having self-bootstrap capability, is expressly contemplated.

Figure 2:
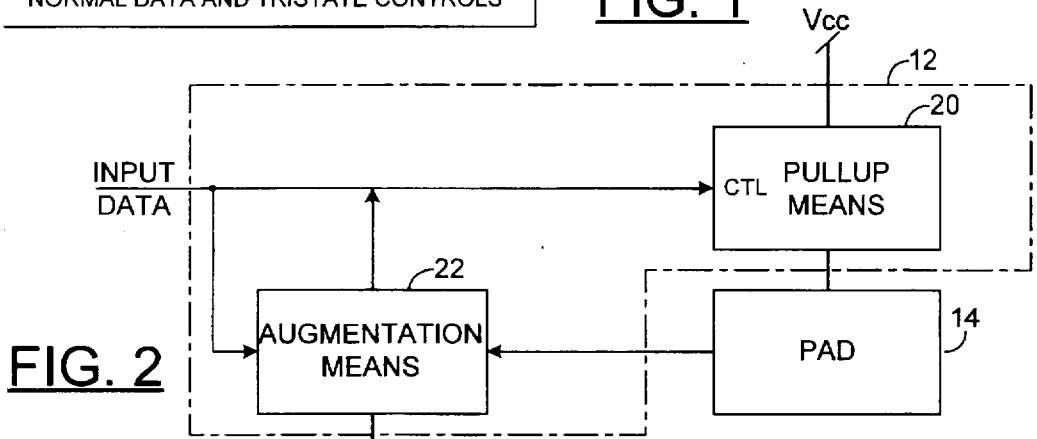
FIG. 2 is a simplified, schematic and block diagram view showing, in greater detail, the output buffer illustrated in block diagram form in FIG. 1, particularly the inventive augmentation circuit according to the present invention.

FIG. 2 shows output buffer 12 in greater detail. In particular, output buffer 12 includes pullup means 20 for generating an output signal in a logic high state, on pad 14, at a voltage magnitude substantially equal to the device operating voltage $V_{cc}$, and, means or circuit 22 for augmenting the input data voltage when a pad voltage level on pad 14 has a non-zero voltage magnitude impressed thereon when the input data signal begins to change from a logic zero to a logic one.

Pullup means 20 includes a control terminal for receiving the input data signal, and includes a self-bootstrap capacitance associated therewith for boosting the voltage level of the input signal as a function of, in part, the pad voltage level then-existing on the pad.

Circuit 22 augments, using normal bootstrapping, a boost amount contributed by the self-bootstrap capacitance to ensure that the voltage magnitude at the control terminal is high enough. In particular, augmentation means 22 ensures that the control terminal voltage is sufficiently greater than the device operating voltage $V_{cc}$ to enable the pullup means to generate the output signal in a logic high state (i.e., $V_{OH}$), at a level not substantially less than $V_{cc}$.

Figure 3:
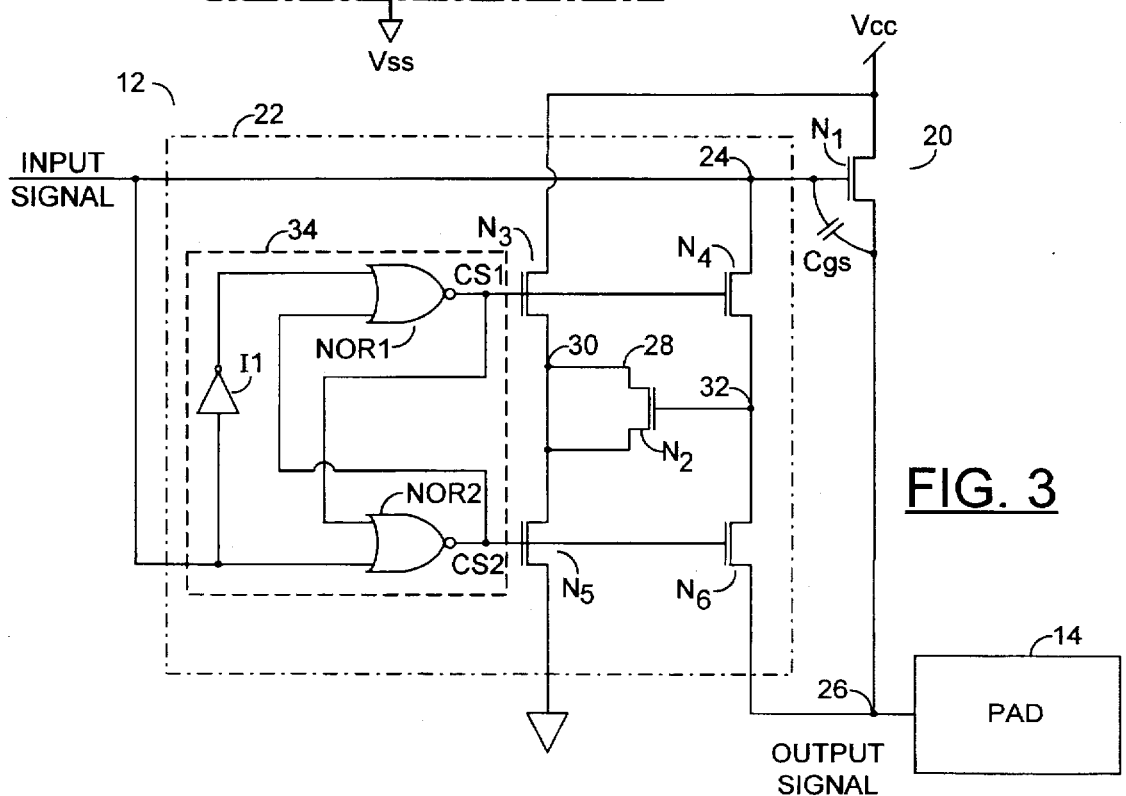
FIG. 3 is a simplified, schematic and block diagram view illustrating a first, preferred embodiment in accordance with the present invention.

FIG. 3 shows a first, preferred embodiment of an output buffer having the inventive augmentation circuit 22 shown in block form in FIG. 2. Pullup means 20 of buffer 12 may be a pullup n-channel field effect transistor N1, having associated therewith a gate-to-source overlap capacitance $C_{gs}$. The capacitance $C_{gs}$ defines a self-bootstrap capacitance for use in bootstrapping the input data signal. Transistor N1 includes a gate terminal connected to node 24 for receiving the input data signal. Transistor N1 also includes a drain terminal connected to a positive bus of the device power supply $V_{cc}$, and, a source terminal connected to output node 26, which in turn is connected to output pad 14. Transistor N1 may be a multi-finger device for providing an increased, aggregate channel width for meeting output current ($I_{OH}$) requirements. In the preferred embodiment, the positive power supply bus $V_{cc}$ produces a predetermined voltage level of approximately 3.3 volts. The conduction of transistor N1 is controlled by a bias voltage on node 24, in a manner generally known, and to be described in particular for this invention hereinafter.

The gate-to-source overlap capacitance $C_{gs}$ of transistor N1 is used to provide a self-bootstrapping feature. It should be appreciated, however, that capacitor $C_{gs}$ is not a distinct structure, but rather, is shown schematically to refer to this structural component of transistor N1.

With continued reference to FIG. 3, augmentation means or circuit 22 includes sensing means 28 having first and second terminals 30 and 32 for sensing and storing the pad voltage level, during a pre-boost interval, switching means comprising third, fourth, fifth, and sixth n-channel transistors N3, N4, N5, and N6, and, means or circuit 34 for generating a pair of non-overlapping control signals CS1, and CS2.

Sensing means 28 senses and stores, during a pre-boost interval (i.e., before a time when the output signal is to be in a logic high state), the pad voltage level on the pad. Although a capacitor may be used, preferably, a second n-channel field effect transistor (FET) N2 is used, wherein a source terminal and drain terminal thereof are connected together to define the first capacitor terminal 30, and the gate terminal thereof defining the second capacitor terminal 32.

The switching means, defined by the switching matrix of transistors N3, N4, N5, and N6, is provided for selectively connecting terminal 32 to the gate of transistor N1 according to the input signal (as processed by way of circuit 34) such that the stored pad voltage level is applied to the gate terminal of N1. In particular, transistors N3 and N4, act together, while transistors N5, and N6, act together. Signals CS1, and CS2 are non-overlapping (i.e., when one of the pair is active, the other one of the pair is inactive), so that either N3 and N4, or, alternatively, N5 and N6, are conducting at any given time. When the lower illustrated pair N5 and N6 are conducting, first capacitor terminal 30 is connected to a negative bus $V_{ss}$ of the device power supply, while second capacitor terminal 32 is connected to pad 14. During an augmentation or boosting time period subsequent thereto, transistors N5 and N6 are deactivated, and transistors N3, and N4 are turned ON. During this augmenting interval, first capacitor terminal 30 is connected to $V_{cc}$, while second capacitor terminal 32 is connected to the gate terminal (i.e., node 24) of pullup transistor N1.

Non-overlapping control signal generating means 34 includes a first NOR-gate NOR1, second NOR gate NOR2, and a first inverter I1. The output terminals of NOR1, and NOR2 output the pair of control signals CS1, and CS2. As described above, when one of these control signals is active (e.g., in this embodiment, a logic high state), the other one of the pair is inactive (e.g., in this embodiment, a logic low state). The operation of the circuit 34 should be understood by one of ordinary skill in the art from inspection thereof, and accordingly, will not be further elaborated upon.

Figure 5:
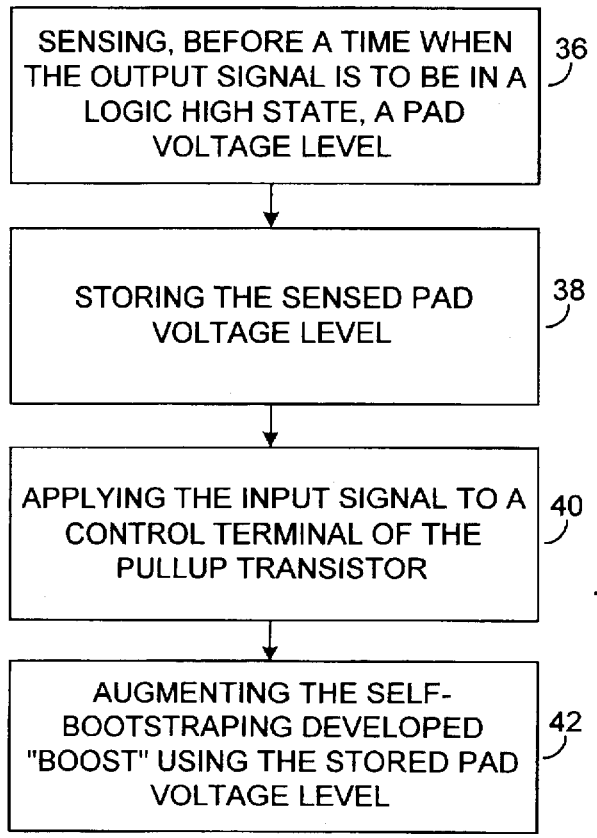
FIG. 5 is a simplified, flow chart diagram illustrating the steps involved in the operation of the present invention.
Figure 6:
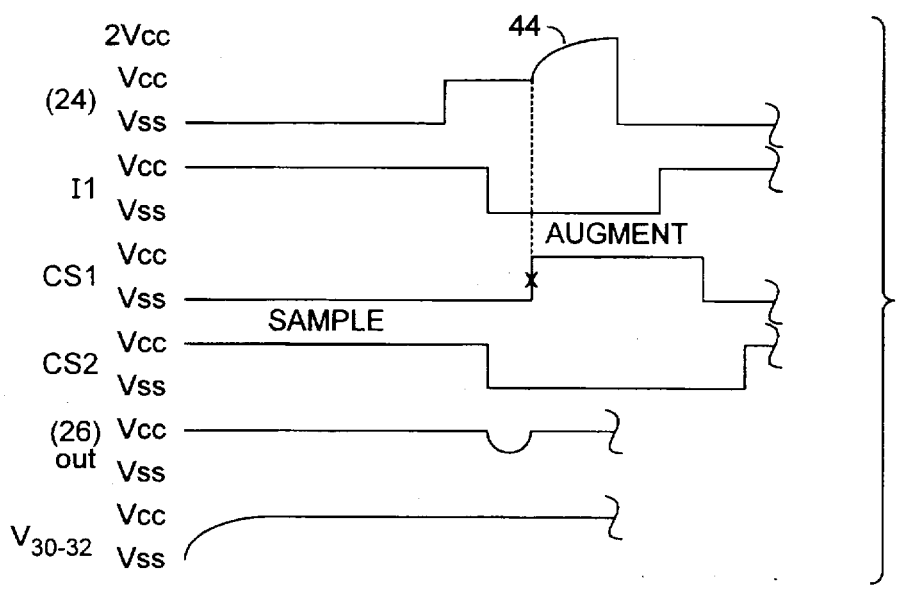
FIG. 6 is a simplified, timing diagram illustrating signal levels at various nodes during the operation of the embodiment illustrated in FIG. 3.

Referring now to FIGS. 5 and 6, a detailed description of the operation of the embodiment illustrated in FIG. 3 will now be set forth. Assume initially that the input data signal to node 24 is low, thus indicating a desire not to activate the pullup transistor N1 to pull the pad up to $V_{cc}$. N1 is thus OFF. Inverter I1 is outputting a logic high state, control signal CS1 is thus at a logic low state, and control signal CS2 is at a logic high state. Switches N5, and N6 are, accordingly, "ON," while switches N3 and N4 are "OFF". It should be appreciated, by the foregoing connections, that the pad voltage level appearing on the pad 14 is thus sensed and stored (i.e., by charging) by transistor N2 (connected as a capacitor). The capacitor is charged to the same level as on the pad. This sensing and storage occurs during a pre-boosting time period (i.e., before a time when the output signal is to be in the logic high state). This is shown in step 38 of FIG. 5. FIG. 6 shows a situation where the output pad 14 has a nonzero voltage (particularly, equal to $V_{cc}$) appearing thereon. This level has been selected for description purposes only. This may occur, for example, when another device pulls pad 14 up to $V_{cc}$. FIG. 6 also shows N2 being charged to the level onto pad 14 (bottommost trace).

When the input signal on node 24 is driven high, then pullup transistor N1 will turn "ON". This is shown in step 40. The details of N1 turning ON, particularly the self-bootstrapping mechanism, are described in the copending application entitled "Ultra Low Power Pumped N-Channel Output Buffer With Self-Bootstrap", referred to under Incorporation by Reference. In sum, when pad 14 is at zero volts, the turning-on process revolves mainly around a boost amount contributed by $C_{gs}$. However, to the extent pad 14 is above zero volts, as here, and as described in the Background, the bootstrapping effect will be reduced by an amount corresponding to the voltage on the pad. This reduction in "boost" must therefore be recovered somehow. This invention provides the means for such recovery. In any event, with the input signal high, switches NS and N6 will turn "OFF" by virtue of the fact that control signal CS2 transitions to a low state. Meanwhile, after a gate delay, switches N3 and N4 will turn ON, by virtue of the fact that control signal CS1 has transitioned to a logic high state. Node 24 (i.e., the gate of transistor N1) is already high due to the logic one input data signal. The capacitor formed by transistor N2 has sampled or stored the pad voltage level impressed thereacross, which shall be indicated $V_3$. Thus, when switches N3, and N4 turn ON (step 42 in FIG. 5), first terminal 30 is connected to $V_{cc}$ by the switching means, while second terminal 32 is connected to node 24. It follows that the voltage generated at second terminal 32 therefore must be $V_{cc}+V3$. Node 24 is thus driven above $V_{cc}$, as shown by a portion of the uppermost trace of FIG. 6 indicated at 44.

In particular, in this preferred embodiment, the augmentation circuit 22 drives node 24 above $V_{cc}$ by a voltage level equal to that on pad 14 during the time in which such voltage level was sampled. The magnitude of this voltage is exactly equal to the loss of voltage pumped onto node 24 by the self-bootstrap of transistor N1 (due to the self-bootstrap capacitance $C_{gs}$) because pad 14 was at a voltage higher than ground. Accordingly, in the preferred embodiment, the total amount of bootstrap voltage onto node 24 is independent of the starting voltage on pad 14. Moreover, as an additional advantage, the circuit of FIG. 3 is not seen as a load by the driver logic gate which typically generates the input signal applied to node 24.

Figure 4:
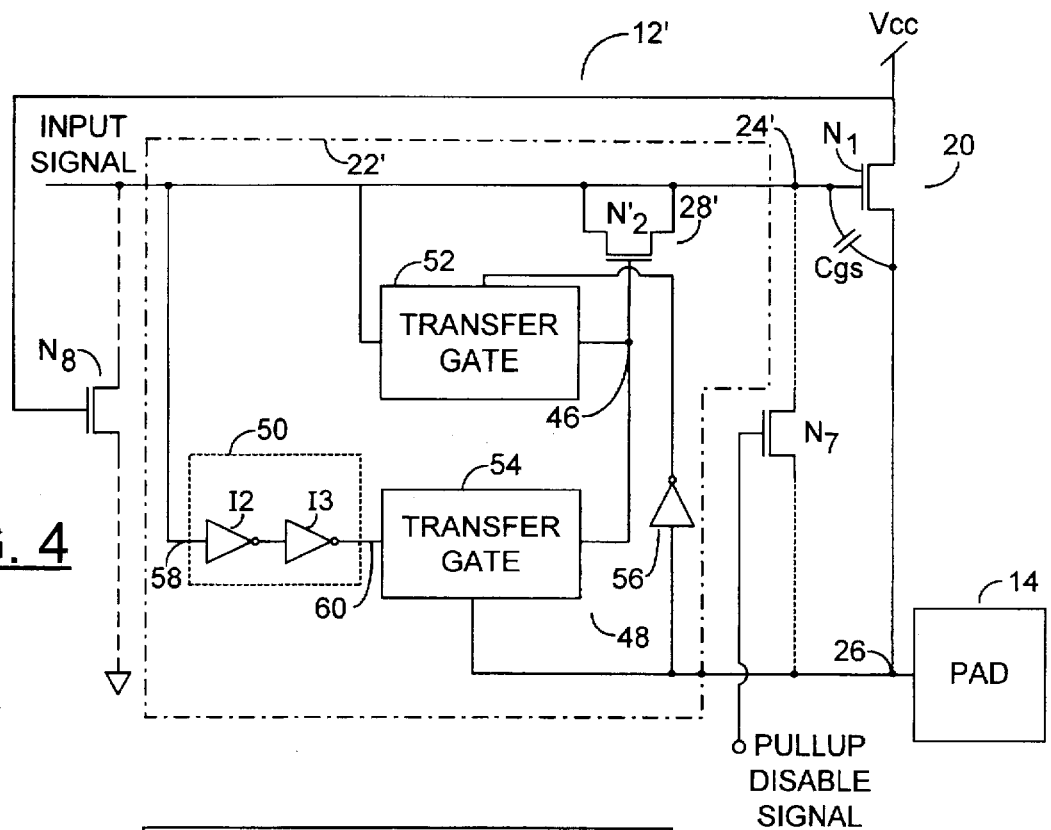
FIG. 4 is a simplified, schematic and block diagram view showing, a second, alternate embodiment according to the present invention.

Referring now to FIG. 4, a second, alternate embodiment of the inventive augmentation circuit is illustrated. This embodiment of the invention also augments the self-bootstrapping using a voltage on the pad. The second embodiment includes a second augmentation circuit 22', in addition to the pullup transistor N1 described above. In this embodiment, a capacitance means 28' is also employed, and, preferably takes the form of n-channel transistor N2' connected as a capacitor. A first terminal of such capacitor is connected to node 24' (i.e., the gate of N1), while the second terminal of such capacitor is connected to a reference node 46. Also included in augmentation circuit 22' is switching means 48, and a delay circuit 50.

Switching means 48 includes a first transmission gate 52, a second transmission gate 54, and an inverter 56. In combination, these components provide the means for selectively connecting reference node 46, by way of transmission gate 52, to the gate of N1 when the pad voltage defines a logic low state. In addition, transmission gate 54 is operative, when controlled to do so, to connect reference node 46 to an output 60 of delay circuit 50. This connection occurs when the pad voltage defines a logic high state. It should be appreciated that when transmission gate 52 is "ON", both sides of capacitor 28' are connected to node 24', and so has relatively little or no effect on the circuit operation, and, further, does not appear as a load to a driver logic gate that is generating the input signal to drive node 24' to a logic high state. It should be further appreciated that when transmission gate 54 is on, reference node 46 connected to capacitor 28' is pulled low by the output of inverter I3. When the input signal is driven to a logic high state, capacitor 28' is charged to $V_{cc}$. Subsequently, after a delay, the reference node 46 (i.e., gate of N2') will be driven high by output 60 of I3. This sharp increase in voltage level will be coupled through capacitor 28' onto node 24', causing the voltage level on node 24' to rise above $V_{cc}$.

Additionally, augmentation circuit 22' may include an n-channel transistor N7, which provides the means for turning transistor N1 ON and OFF quicker. In particular, when transistor N1 is desired not to be ON, other logic (not shown) can generate a disable N1 signal, which operates to turn transistor N7 ON. With transistor N7 conducting, transistor N1, in effect, has its gate terminal tied to its source terminal (instead of having the gate tied to the negative bus of the power supply $V_{ss}$). Under these conditions, transistor N1 cannot turn ON, since its $V_{gs}$ is zero, but its gate terminal, node 24', can be allowed to track the output voltage level on pad 14, and thus, potentially, can be driven to $V_{cc}$ faster (depending on what voltage levels in-fact appear on pad 14). Additionally, it should be noted that an n-channel transistor N8 may also be included in the embodiment to provide a high resistance, very low current path between node 24', and ground to ensure that the gate terminal of N1 does not float to a logic high state (with the subsequent result that N1 would be erroneously turned ON) when transistor N7 starts to shut off, such as where the voltage on pad 14 nears $V_{cc}$.

Figure 7:
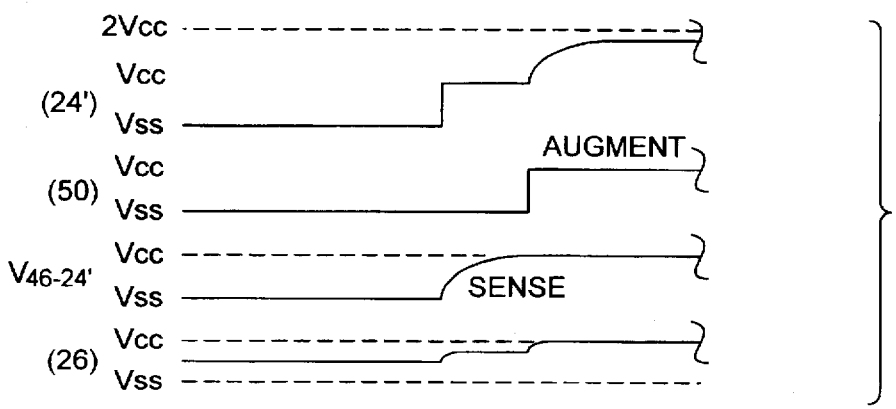
FIG. 7 is a simplified, timing diagram showing signal levels at various nodes for the embodiment illustrated in FIG. 4.

Referring now to FIG. 7, a timing chart diagram illustrates voltage levels on various nodes during the operation of the embodiment of FIG. 4. The uppermost trace of FIG. 7 illustrates the transition of the input data signal from low-to-high (from $V_{ss}$ to $V_{cc}$). Once the input signal goes high, the circuitry of FIG. 4 determines whether the level on the pad defines a logic low, or a logic high state. As shown in the lowermost trace of FIG. 7, a level slightly above midway between $V_{ss}$, and $V_{cc}$ is arbitrarily chosen to be on the output node 26. Accordingly, such a level may define, and is hereby assumed to define for purposes of description, a logic high state. However, the input signal, a logic high, has not yet propagated through delay circuit 50. Therefore, even though transmission gate 54 is turned "ON" by the voltage level on pad 14, it merely transfers a ground potential to the reference node 46. Therefore, as described above, capacitor 28' is charged to $V_{cc}$ due to the fact that $V_{cc}$ is applied to one terminal, while $V_{ss}$ is applied to its other terminal. This is indicated in the second trace from the bottom in FIG. 7. When the output of I3, at node 60, transitions to a logic high state, as shown in the second trace from the top in FIG. 7, then the voltage stored on capacitor 28' (indicated in FIG. 7 as $V_{46-24}'$) is coupled through to node 24' to thereby "boost" the voltage on the gate of N1 to substantially higher than $V_{cc}$, as shown on the uppermost trace of FIG. 7.

Figure 8:
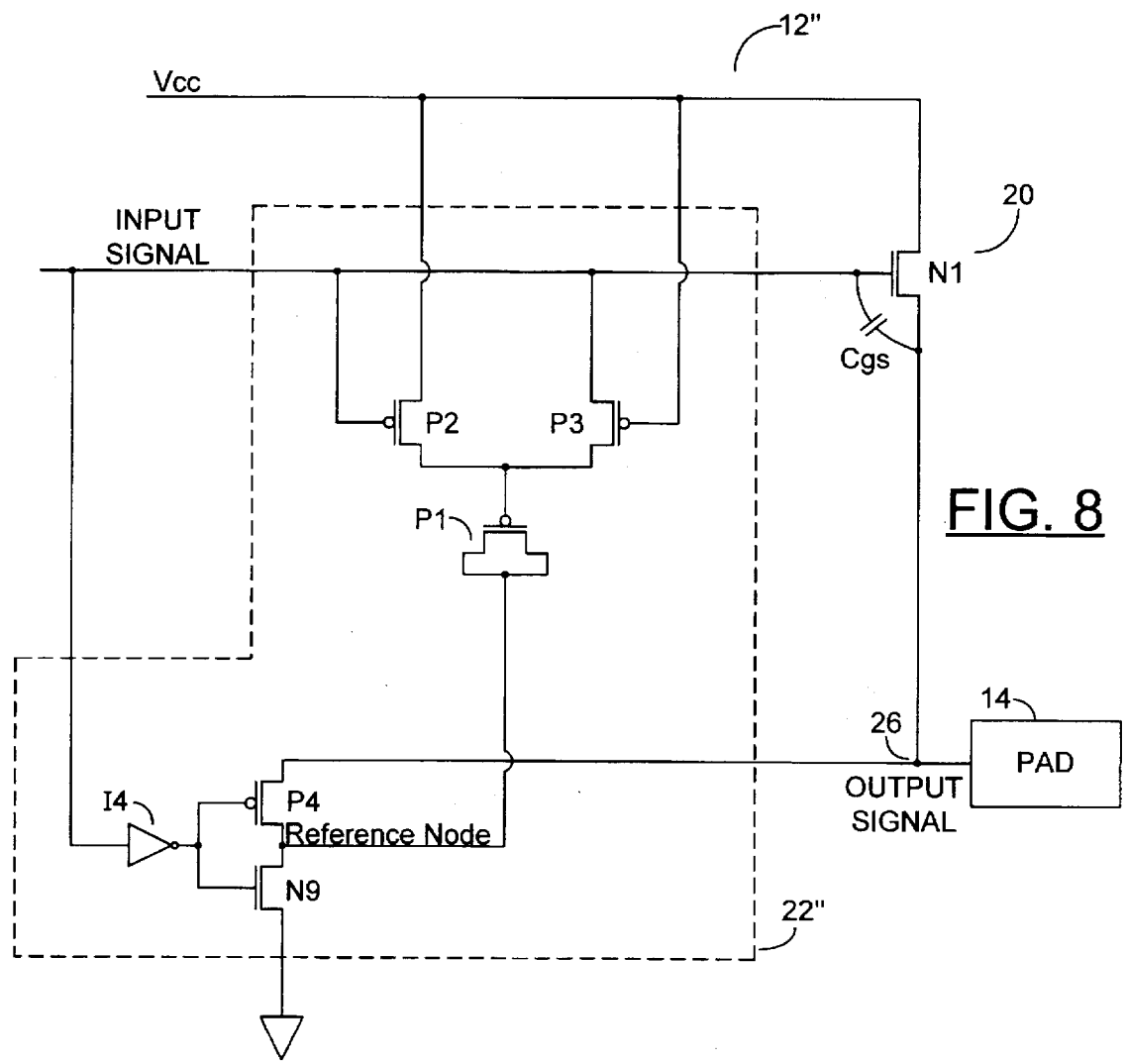
FIG. 8 is a simplified, schematic and block diagram view showing a third, alternate embodiment according to the present invention.

FIG. 8 shows yet a third embodiment in accordance with the present invention, namely output buffer 12". Output buffer 12" includes pullup means 20, such as n-channel FET N1 having bootstrap capacitance $C_{gs}$, associated therewith, and means, such as circuit 22", for augmenting the voltage amount contributed by self-bootstrap capacitance $C_{gs}$, when the output node voltage level, before a time when the output signal is to be logic one, has a non-zero voltage magnitude impressed thereon. Circuit 22" includes a capacitive device, such as capacitor-connected p-channel FET P1, a first switching circuit and a second switching circuit wherein the first switching circuit comprises a second p-channel transistor P2, and a third p-channel transistor P3, and, wherein the second switching circuit comprising an inverter I4, a fourth p-channel transistor P4, and an n-channel transistor N9.

Transistor P1 is used as a capacitor and includes a first capacitor terminal connected to the first switching circuit, a second capacitor terminal connected to a reference node (indicated REFERENCE NODE in FIG. 8).

The first switching circuit is provided for connecting the first capacitor terminal to the power supply $V_{cc}$ when the input signal is in a first state (i.e., a logic zero state in the illustrated embodiment).

The second switching circuit is provided for selectively connecting the reference node to a ground node having a ground potential, and further, to the output node, which is connected to pad 14, when the input signal is in the first state (i.e., a logic zero), and a second state (i.e., a logic one), respectively. This embodiment is very useful for low power applications, as will be described in further detail hereinafter.

In operation, the circuit 22" augments the voltage of the input signal when the output node is at a non-zero voltage level, such as that which may occur when the output buffer 12" is tri-stated and an external device holds the node high. Initially, assume that pullup transistor N1 is desired to be OFF (i.e., the output node is desired to be at a logic zero because the pulldown transistor is ON, or, the pad is tri-stated because both pullup and pulldown transistors are off). Accordingly, the input signal assumes a logic low or logic zero state, so transistor P2 is ON, and the gate terminal of transistor P1 is thus tied to the power supply $V_{cc}$. Further, transistor N9 is also on, because inverter I4 is producing a logic 1, and so the source terminal/drain terminal of transistor P1 is coupled to ground by way of transistor N9. Hence, the capacitive device P1 is charged so that a voltage potential that is approximately equal to $V_{cc}$ is impressed between its gate terminal, and source/drain terminal connection.

When the input signal transitions from a logic zero to a logic one, transistor N1 turns ON, and will thus begin to pull the output node 26 up towards the power supply $V_{cc}$ if the output node had been low (which may not necessarily have been the case if the output node had been "tri-stated".) Hence, the gate terminal of transistor N1 will be self-bootstrapped by $C_{gs}$, as described in copending application entitled "ULTRA LOW POWER PUMPED N-CHANNEL OUTPUT BUFFER WITH SELF-BOOTSTRAP".

After a predetermined delay associated with inverter I4, inverter I4 will change its output from a logic high, to a logic low, and therefore turn transistor N9 OFF, and transistor P4 ON. Transistor P4 will drive the source terminal/drain terminal connection of transistor P1 to the same voltage level then-existing on the output node 26. It should be further noted that if the output node 26 was originally low, then, transistor N1 has to supply the electrical current, through transistor P4, in order to pull up the source terminal/drain terminal connection of P1—another example of self-bootstrapping.

Since P1 is configured as a capacitor when the source/drain terminals are driven high, the gate terminal thereof must go high as well. When this occurs, transistor P2 will turn hard OFF, since the input signal connected to its gate terminal is now at a logic one S (i.e., equal to $V_{cc}$), and both source and drain terminals are at $V_{cc}$, or higher—there is thus no negative $V_{gs}$.

Further note that transistor P3 has its gate terminal connected to power supply $V_{cc}$. If the gate terminal of transistor P1, which is connected to the drain terminal of transistor P3, goes to a p-channel $V_{gs}$ above $V_{cc}$, then, transistor P3 will turn ON to thereby connect P1 to the gate terminal of transistor N1. So as the gate terminal of transistor P1 is driven above $V_{cc}$, it will attempt to pull the gate terminal N1 above $V_{cc}$ as well—this action is the required bootstrap augmentation.

One important advantage of this embodiment is that the capacitive device (p-channel transistor P1) is not actually discharged in any part of the output cycle. That is, it always appears to have a charging voltage of about $V_{cc}$ impressed thereacross. Since there is no change in the voltage across the capacitive device, there is no charging current (i.e., no power is taken from the power supply to implement the bootstrap augmentation). This embodiment is particularly useful for low power applications.

While the present invention has been particularly shown and described with reference to the preferred embodiments thereof, it is well understood by those skilled in the art that various changes and modifications can be made in the invention without departing from the spirit and scope thereof, the invention being limited only by the appended claims.

I claim:

1. An output buffer responsive to an input signal for generating an output signal on an output node comprising:
   a pullup circuit configured to generate said output signal in a high logic state at a voltage level substantially equal to a device operating voltage level, said pullup circuit including (i) a control terminal and (ii) a self-bootstrap capacitance configured to boost a voltage level of said input signal applied to said control terminal as a function of an output node voltage level;
   an augmentation circuit configured to increase the amount of voltage generated by said self-bootstrap capacitance to enable said pullup circuit to generate said output signal in said high logic state at a level substantially equal to said device operating voltage level; and
   a switching circuit configured to selectively connect said augmentation circuit to said control terminal of said pullup circuit, wherein the voltage level stored at said output node is applied to the control terminal of the pullup circuit.

2. The output buffer of claim 1 wherein said pullup circuit includes a pullup n-channel field effect transistor having a source terminal and a drain terminal connected between a positive bus of a first power supply generating said device operating voltage level and said output node, said pullup n-channel transistor further including a gate terminal defining said pullup circuit control terminal.

3. The output buffer of claim 1 wherein said augmentation circuit comprises:
   a sensing circuit configured to store said output node voltage level.

4. The output buffer of claim 3 wherein said sensing circuit includes a capacitive device connected to said switching circuit.

5. The output buffer of claim 4 wherein said capacitive device comprises a second field effect transistor having a source terminal and a drain terminal connected together to define a first capacitor terminal, said second field effect transistor further including a gate terminal defining a second capacitor terminal.

6. The output buffer of claim 1 wherein said switching circuit comprises:
   a control circuit responsive to said input signal configured to generate a pair of non-overlapping control signals on a first and a second output terminal thereof wherein when one of said pair of control signals is active the other one of said pair is inactive; and a switching matrix responsive to said pair of control signals configured to (i) switch a selected one of first and second capacitor terminals between said output node and said control terminal of said pullup circuit and (ii) switch the other one of said first and second capacitor terminals between a negative bus and of positive bus.

7. The output buffer of claim 6 wherein said control circuit comprises:

a first NOR gate having a first and a second input terminal and a first output terminal;

a second NOR gate having a third and a fourth input terminal and a second output terminal; and an inverter having a fifth input terminal, and a third output terminal;

said fifth input terminal of said inverter being connected to said receive said input signal, said first and second input terminals of said first NOR gate being connected to said third output terminal of said inverter, and said second output terminal of said second NOR gate, respectively, said third and fourth input terminals of said second NOR gate being connected to said first output terminal of said first NOR gate and said fifth input terminal of said inverter, respectively, wherein said first output terminal of said first NOR gate and said second output terminal of said second NOR gate generate said pair of control signals.

8. The output buffer of claim 7 wherein said switching matrix comprises:

a third and a fourth n-channel transistor each having a respective gate terminal connected to said first output terminal of said first NOR gate; and, a fifth and a sixth n-channel transistor each having a respective gate terminal connected to said second output of said second NOR gate;

wherein said third transistor and said fifth transistor switch a first capacitor terminal between said positive bus and said negative bus, said fourth transistor and said sixth transistor switch a second capacitor terminal between said gate terminal of said pullup n-channel transistor and said output node.

9. The output buffer of claim 1 wherein said augmentation circuit comprises:

a capacitance circuit having a first capacitor terminal connected to said control terminal of said pullup circuit and a second capacitor terminal connected to a first nodes, said capacitance circuit configured to sense and store a voltage difference existing between said control terminal and said first node, wherein said output node voltage level defines said high logic state to enable said pullup circuit to generate said output signal.

10. The output buffer of claim 9 wherein said capacitance circuit comprises a field effect transistor having a source terminal and a drain terminal connected together to define said first capacitor terminal, said field effect transistor further including a gate terminal defining said second capacitor terminal.

11. The output buffer of claim 10 wherein said switching circuit comprises:

a first transfer gate configured to connect said first node to said control terminal of said pull up circuit when said output node voltage level defines a low logic state; and a second transfer gate for connecting said first node to output terminal of a delay circuit when said output node voltage level defines said high logic state.

12. The output buffer of claim 11 wherein said delay circuit comprises a pair of inverter gates connected in-series wherein an input terminal of a first one of said inverter gates is connected to said control terminal and an output terminal of said one inverter gate is connected to an input terminal of the other one of said inverter gates, a delayed version of said input signal being generated on an output terminal of the other one of said inverter gates.

13. The output buffer of claim 10 further including a second n-channel field effect transistor having a source terminal and a drain terminal defining a channel region therebetween for connecting said output node to said control terminal according to a pullup disable signal, said second n-channel transistor further having a gate terminal to which said disable signal is applied.

14. The output buffer of claim 13 further including a third n-channel field effect transistor having a source terminal and a drain terminal thereof to define a second, highly resistive channel region therebetween for connecting said control terminal to a negative bus of said first power supply to thereby inhibit said pullup n-channel transistor from conducting when a conductivity level of said second n-channel transistor decreases as said output node voltage level approaches a positive bus voltage.

15. The output buffer of claim 2 wherein said augmentation circuit means comprises:

a capacitive device having a first capacitor terminal, and a second capacitor terminal connected to a first node;

a first switching circuit for connecting said first capacitor terminal to said first power supply when said input signal is in a first state;

a second switching circuit for selectively connecting said first node to a ground node having a ground potential, and said output node when said input signal is in said first and a second state, respectively; and, wherein said capacitive device is charged to a voltage level substantially equal to said device operating voltage level during an initial one of said first and second states of said input signal, said first switching circuit including a switching device connected to said first terminal of said capacitive device for transferring an output node voltage level together with said device operating voltage level onto said gate terminal of said n-channel pullup transistor during said second state of said input signal.

16. The output buffer of claim 15 wherein said capacitive device remains charged during said second state of said input signal to thereby reduce operating power consumption.

17. An augmentation circuit for use with an output buffer comprising:

a control signal source having an input terminal for receiving an input signal to the buffer and an output terminal for generating a pair of switch control signals having active and inactive states; and, a sampling circuit having an output terminal connected to an n-channel pullup transistor of the output buffer wherein the pullup transistor has a self-bootstrap capacitance associated therewith, said sampling circuit further including a first input terminal connected to an output node of the buffer, said sampling circuit sampling an output node voltage level when one of said control signals is in said active state and supplying said sampled output node voltage level on said output terminal when said one control signal is in said inactive state;

wherein when said one control signal becomes inactive and said sampled output node voltage level has a nonzero voltage magnitude, a self-bootstrap voltage amount contributed by said self-bootstrap capacitance is augmented by said sampled output node voltage level to thereby enable said pullup transistor to pull said output node substantially to an operating voltage level.

18. The augmentation circuit of claim 17, wherein said pair of switch control signals comprise non-overlapping switch control signals, and wherein said sampling circuit comprises:

a capacitive device having a first terminal and a second terminal;

a first pair of switches configurable to connect said first and second terminals of said capacitive device to a ground node and said output node, respectively, when said one of said pair of switch control signals is active; and a second pair of switches configurable to connect said first and second terminals of said capacitive device to an operating voltage source generating said operating voltage level and said output terminal which is connected to a gate terminal of said pullup transistor, respectively, when the other one of said pair of switch control signals is active to thereby augment said self-bootstrap voltage amount.

19. The augmentation circuit of claim 18 wherein said control signal source comprises:

a pair of NOR gates connected in a feedback arrangement for generating said pair of non-overlapping switch control signals as a function of said input signal, each one of said pair of NOR gates having a respective output terminal which, collectively, outputs said pair of switch control signals, wherein when one of said pair of switch control signals is active, the other one of said pair of switch control signals is inactive.

20. The augmentation circuit of claim 18 wherein said capacitive device comprises a second n-channel field effect transistor including source and drain terminals connected together to define said first terminal of said capacitive device, said second field effect transistor further including a gate terminal defining said second terminal.

21. An augmentation circuit for use with an output buffer comprising:

a delay circuit having an input terminal for receiving an input signal to the buffer, and an output terminal for generating a delayed version of said input signal; and, a sampling circuit having an output terminal connected to an n-channel pullup transistor of the output buffer wherein the pullup transistor has a self-bootstrap capacitance associated therewith, said sampling circuit having a first input terminal connected to said delay circuit for receiving said delayed version of said input signal, said sampling circuit further including a second input terminal connected to an output node of the buffer for sampling an output node voltage level;

wherein when said sampled output node voltage level has a sufficient magnitude to define a high logic state, a self-bootstrap voltage amount contributed by said self-bootstrap capacitance is augmented by an augmentation voltage amount derived from said delayed version of said input signal to thereby enable said pullup transistor to pull said output node substantially to an operating voltage level.

22. The augmentation circuit of claim 21 wherein said sampling circuit comprises:

a capacitive device having a first capacitor terminal connected to said output terminal of said sampling circuit, which is connected to a gate terminal of said pullup transistor, and a second capacitor terminal connected to a first node;

a first transfer gate controlled to connect said first node to receive said delayed version of said input signal when said sampled output node voltage level defines said high logic state; and, a second transfer gate controlled to connect said first node to said output terminal of said sampling circuit when said sampled output node voltage level defines a logic low state.

23. The augmentation circuit of claim 22 wherein said capacitive device includes a second n-channel field effect transistor having source and drain terminals connected together to define said first capacitor terminal, said second transistor further including a gate terminal defining said second capacitor terminal.

24. A method of operating an output buffer comprising the steps of:

(A) sensing an output node voltage level before a time when an output signal on an output node of the buffer is to be in a logic high state and electrically connecting a capacitive device to an output node and a ground node in response to an input signal;

(B) storing the output node voltage level sensed in step (A);

(C) applying the input signal to a control terminal of a pullup transistor, wherein a self-bootstrap capacitance associated therewith is responsive to the input signal to boost an input signal voltage magnitude as a function of the output node voltage level; and, (D) augmenting a boost voltage contributed by the self-bootstrap capacitance using the stored output node voltage to ensure that a control terminal voltage magnitude developed at the control terminal is greater than a device operating voltage level wherein said pullup transistor is enabled to pull the output node to the device operating voltage level.

25. The method of claim 24 wherein step (D) is performed by the substeps of:

additively combining the stored output node voltage level and the device operating voltage level to form an augmentation voltage signal; and, applying the augmentation voltage signal to the control terminal.

26. A method of operating an output buffer comprising the steps of:

(A) sensing, before a time when an output signal on an output node of the buffer is to be in a logic high state, an output node voltage level;

(B) applying an augmentation signal generated by combining an input signal and a delayed version input signal to a control terminal of a pullup transistor wherein a self-bootstrap capacitance associated therewith is responsive to the input signal to boost an input signal voltage magnitude as a function of the sensed output node voltage level; and (C) augmenting a boost voltage amount contributed by the self-bootstrap capacitance when the sensed output node voltage level defines said logic high state to ensure that a control terminal voltage magnitude developed at the control terminal is greater than a device operating voltage level, wherein said pullup transistor is enabled to pull the output node to the device operating voltage level.

* * * * *